(12) United States Patent
Yamakawa et al.

(10) Patent No.: US 8,604,573 B2
(45) Date of Patent: Dec. 10, 2013

(54) SEMICONDUCTOR MEMORY DEVICE

(75) Inventors: Koji Yamakawa, Tokyo (JP); Katsuaki Natori, Yokohama (JP); Daisuke Ikeno, Yokohama (JP); Yasuyuki Sonoda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 13/425,345

(22) Filed: Mar. 20, 2012

(65) Prior Publication Data

US 2012/0326252 A1 Dec. 27, 2012

(30) Foreign Application Priority Data

Jun. 24, 2011 (JP) ................................. 2011-141044

(51) Int. Cl.
*H01L 29/82* (2006.01)
*G11C 11/02* (2006.01)

(52) U.S. Cl.
USPC ........... 257/421; 257/422; 257/423; 257/424; 257/425; 257/427; 438/3; 365/157; 365/171; 360/324.2

(58) Field of Classification Search
USPC ........ 257/20, 414, 421–427, E29.323; 438/3; 360/324–326, 313; 365/157–158, 365/171–173
See application file for complete search history.

(56) References Cited

U.S. PATENT DOCUMENTS

| 7,230,308 | B2 | 6/2007 | Iwata | |
| 7,932,572 | B2 | 4/2011 | Tsujiuchi | |
| 2010/0176472 | A1* | 7/2010 | Shoji | ............................. 257/421 |
| 2010/0200939 | A1 | 8/2010 | Hosomi et al. | |
| 2011/0163401 | A1 | 7/2011 | Tsujiuchi | |

FOREIGN PATENT DOCUMENTS

| JP | 2009-026944 A | 5/2009 |
| JP | 2009-194210 A | 8/2009 |
| JP | 2010-165790 A | 7/2010 |
| WO | WO2006-054588 A1 | 5/2006 |

* cited by examiner

*Primary Examiner* — Jami M Valentine
(74) *Attorney, Agent, or Firm* — Knobbe, Martens, Olson & Bear, LLP

(57) ABSTRACT

According to one embodiment, a semiconductor memory device includes plural magneto-resistance elements. In the semiconductor memory device, each of the magneto-resistance elements includes: a first magnetic layer formed on a semiconductor substrate, the first magnetic layer having an easy axis of magnetization perpendicular to a film surface thereof; a non-magnetic layer formed on the first magnetic layer; a second magnetic layer formed on the non-magnetic layer, the second magnetic layer having an easy axis of magnetization perpendicular to a film surface thereof; and a sidewall film provided so as to cover a sidewall of each of the magneto-resistance elements with a protective film interposed therebetween, the sidewall film providing a tensile stress to the magneto-resistance element along the easy axis of magnetization.

11 Claims, 6 Drawing Sheets

SEMICONDUCTOR MEMORY DEVICE

CROSS-REFERENCE TO RELATED APPLICATION

This application is based upon and claims the benefit of priority from prior Japanese Patent Application No. 2011-141044, filed on Jun. 24, 2011, the entire contents of which are incorporated herein by reference.

FIELD

Embodiments of the present invention relate to a semiconductor memory device.

BACKGROUND

Recently, a Magnetic Random Access Memory (hereinafter abbreviated to MRAM) in which a Tunneling Magneto Resistive (hereinafter abbreviated to TMR) effect is utilized is developed as a nonvolatile semiconductor memory (semiconductor memory device). The MRAM is a nonvolatile semiconductor memory having features such as high-speed write/read, a low-power-consumption operation, and a high density memory storage, and expected to be applied as a working memory. The MRAM includes a Magnetic Tunnel Junction (hereinafter abbreviated to MTJ) element, and the MTJ element is a magneto-resistance element having a large magneto-resistance value.

Particularly, the MTJ element basically adopts a three-layer stacked structure including a storage layer made of a magnetic film in which data is stored by changing a magnetization direction, a reference layer made of magnetic films that is used to unidirectionally fixed magnetization, and a tunnel junction layer (non-magnetic layer) that is made of an insulating film and formed between the storage layer and the reference layer. When a current is passed through the MTJ element including storage layer/tunnel junction layer/reference layer, a resistance value of the MTJ element is changed according to the magnetization direction of the storage layer relative to the magnetization direction of the reference layer. Specifically, the resistance value takes a minimum value when the magnetization directions of the storage layer and the reference layer are parallel to each other, and the resistance value takes a maximum value when the magnetization directions are antiparallel. The phenomenon is called a Tunneling Magneto-Resistance effect (hereinafter referred to as a TMR effect), and the TMR effect is utilized in a memory operation such that the state in which the magnetization directions of the storage layer and the reference layer are parallel is set to data "0" while the state in which the magnetization directions of the storage layer and the reference layer are antiparallel is set to "1".

Conventionally, in order to operate the MRAM, a current is passed through a wiring disposed near the storage layer of the MTJ element, and the magnetization direction of the storage layer is inverted by utilizing a magnetic field generated near the storage layer (magnetic field write method). However, in the magnetic field write method, although the generated magnetic field can be increased with increasing current, the current permitted in the wiring is restricted due to the maximum current density based on reliability of the miniaturized MRAM, whereby the large-capacity memory of the MRAM is hardly fabricated. The write current necessary to write the data can be decreased by bringing the wiring closer to the storage layer or by devising a material used for the wiring. However, a coercive field of the storage layer is increased in principle by the miniaturization of the MJT element. That is, in the magnetic field write method, it is difficult to achieve a balance between the miniaturization of the MTJ element and the decrease of the write current.

Therefore, recently a spin injection write method in which the magnetization is inverted by utilizing a spin-polarization current is being investigated. In the spin injection write method, the spin-polarization current is passed through the MTJ element to invert the magnetization direction of the storage layer. In the spin injection write method, the number of spin-polarized electrons necessary for the magnetization inversion is decreased with reducing volume of the storage memory in which the magnetization direction is inverted, which allows the write current to be decreased.

DETAILED DESCRIPTION

Figure 1:
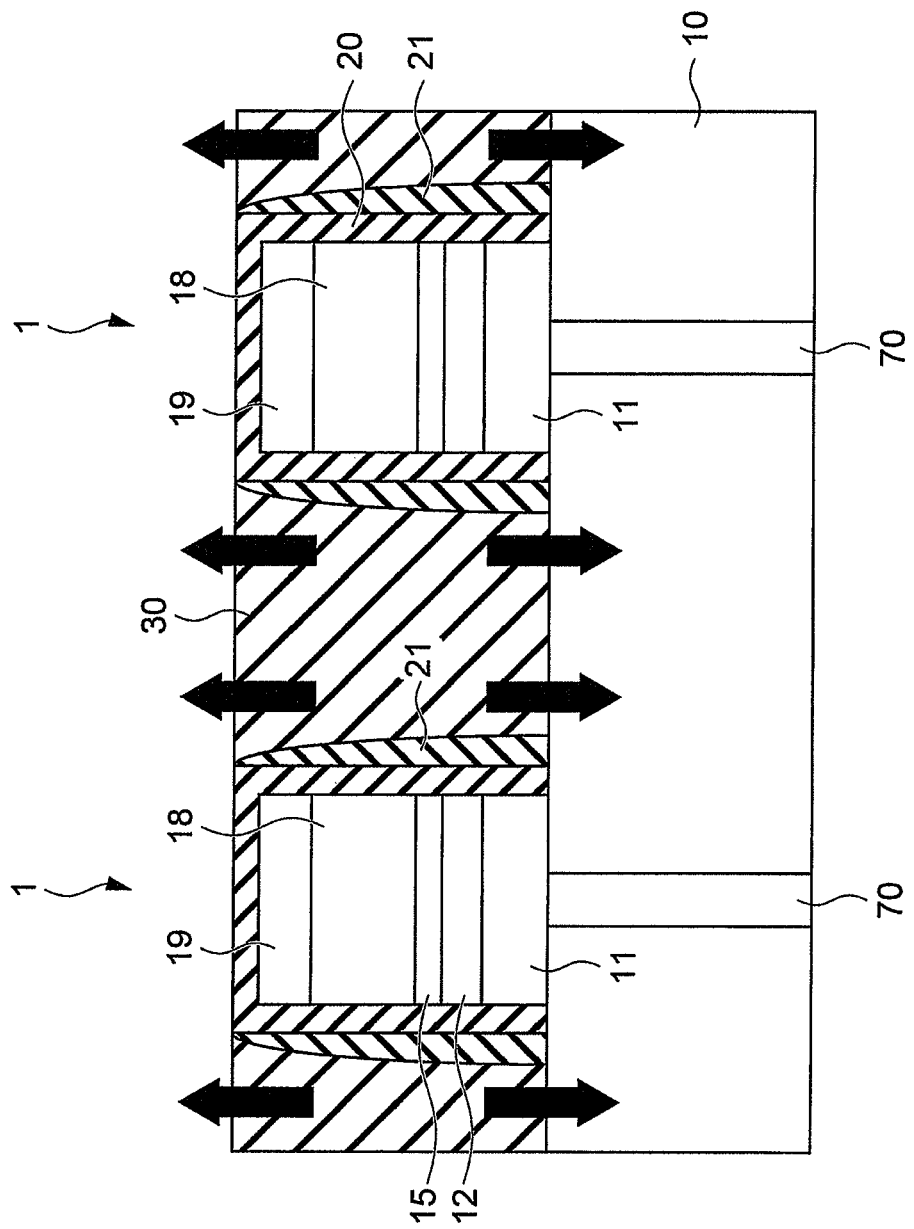
FIG. 1 is a sectional view (part 1) of a semiconductor memory device according to a first embodiment.

In one embodiment, a semiconductor memory device includes plural magneto-resistance elements. In the semiconductor memory device, each of the magneto-resistance elements includes: a first magnetic layer formed on a semiconductor substrate, the first magnetic layer having an easy axis of magnetization perpendicular to a film surface thereof; a non-magnetic layer formed on the first magnetic layer; a second magnetic layer formed on the non-magnetic layer, the second magnetic layer having an easy axis of magnetization perpendicular to a film surface thereof; and a sidewall film provided so as to cover a sidewall of each of the magneto-resistance elements with a protective film interposed therebetween, the sidewall film providing a tensile stress to the magneto-resistance element along the easy axis of magnetization.

Hereinafter, embodiments will be described with reference to the drawings. However, the invention is not limited to the embodiments. In all the drawings, a common portion is denoted by a common numeral, and the overlapping description is omitted. The drawings are schematic drawings for the purpose of easy understanding of the invention, and sometimes a shape, a size, and a ratio of the device in the drawings differ from those of the actual device. However, design changes of the shape, the size, and the ratio of the device can properly be made by referring to the following description and the well-known art.

First Embodiment

Figure 2:
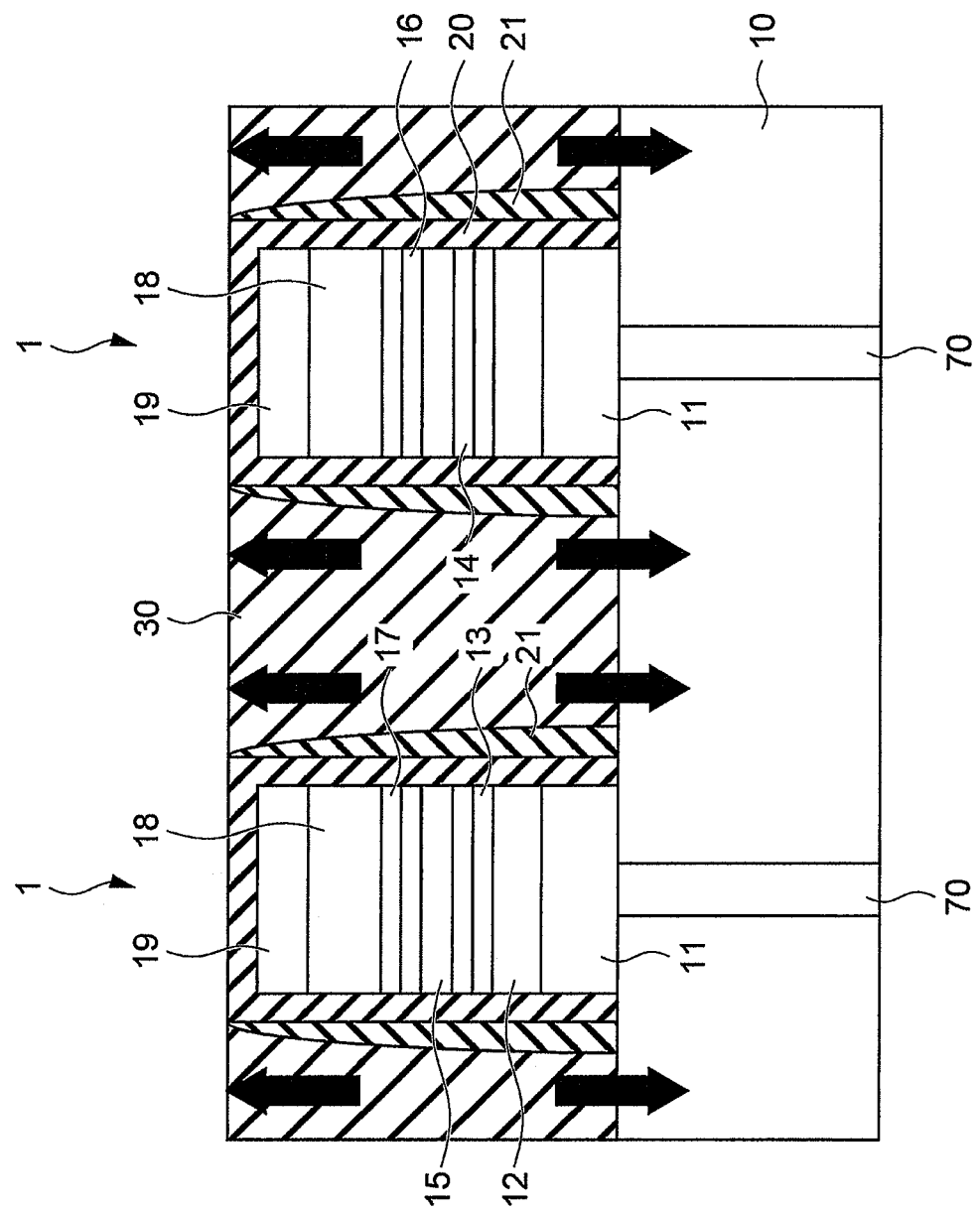
FIG. 2 is a sectional view (part 2) of the semiconductor memory device of the first embodiment.

A semiconductor memory device according to a first embodiment will be described with reference to FIGS. 1 and 2. FIGS. 1 and 2 illustrate sections of the semiconductor memory device of the first embodiment. In the first to fourth embodiments, a spin-injection write type MRAM (semiconductor memory device) including an MTJ element (magneto-resistance element) 1 in which a perpendicular magnetic film is used will be described by way of example. The perpendicular magnetic film means a magnetic film in which a direction (easy axis of magnetization direction) of magnetization is substantially perpendicular to a film surface thereof.

As illustrated in FIG. 1, the MTJ element 1 of the first embodiment has a stacked structure including a lower metallic layer 11 that is formed on a semiconductor substrate 10 including a contact plug 70, a storage layer (first magnetic layer) 12 that is formed on the lower metallic layer 11 and made of the perpendicular magnetic film, a tunnel junction layer (non-magnetic layer) 15 that is formed on the storage layer 12, a reference layer (second magnetic layer) 18 that is formed on the tunnel junction layer 15 and made of the perpendicular magnetic film, and a cap layer 19 that is formed on the reference layer 18. A protective film 20 is formed so as to cover a sidewall and an upper surface of the MTJ element 1. A sidewall film 21 having a stress covers the sidewall of the MTJ element 1 with the protective film 20 interposed therebetween. In the first embodiment, the two sidewall films 21 are formed while the sidewalls on both sides of the MTJ element 1 are sandwiched therebetween. However, there is no particular limitation to the formation of the sidewall film 21. For example, the sidewall film 21 may be formed so as to surround the MTJ element 1 from all sides. In the sidewall film 21, a portion covering the storage layer 12 is thicker than a portion covering the reference film 18.

The sidewall film 21 internally has a compressive stress exceeding, for example, 1 GPa, and the sidewall film 21 provides a tensile stress so as to vertically drag the MTJ element 1 along the magnetization directions of the storage layer 12 and the reference layer 18 as indicated by arrows in FIG. 1. Particularly, because the MTJ element 1 and the protective film 20 adjacent to the sidewall film 21 do not expand while the sidewall film 21 expands, the sidewall film 21 internally has the compressive stress, and relatively provides the tensile stress to the MTJ element 1 and the protective film 20 adjacent to the sidewall film 21. Accordingly, the sidewall film 21 can provide a strain in a constant direction to each lattice in the magnetic films constituting the storage layer 12 and the reference layer 18, and stabilize the magnetization in the direction. In the sidewall film 21, the portion covering the storage layer 12 is thickened to further apply the stress to the storage layer 12, so that the stability of the magnetization direction stored in the storage layer 12 with respect to thermal disturbance can be improved to suppress variations in electric and magnetic characteristics of the MTJ element 1 such as the write current, activation energy for magnetic inversion, and perpendicular magnetic anisotropy.

As illustrated in FIG. 2, which is of a sectional view of a modification of the first embodiment, interface magnetic layers 14 and 16 may be formed between the storage layer 12 and the tunnel junction layer 15 and between the tunnel junction layer 15 and the reference layer 18, respectively. Additionally, diffusion preventing films 13 and 17 may be formed between the storage layer 12 and the interface magnetic layer 14 and between the interface magnetic layer 16 and the reference layer 18, respectively. Because the interface magnetic layers 14 and 16 have high polarizability, the MTJ element 1 includes the interface magnetic layers 14 and 16 to acquire the large TMR. In heat treatment processes such as a crystallization heat treatment of the tunnel junction layer 15, the formation of an insulating film 30, Reactive Ion Etching (RIE), and the formation of the wiring in a semiconductor memory device producing process, diffusion of a metallic element constituting each layer is prevented by providing the diffusion preventing film 13 and 17 in the MTJ element 1, thereby preventing degradation of magnetization characteristics of the storage layer 12 and the reference layer 18 and electric characteristics (such as TMR effect) of the MTJ element 1. Additionally, crystallinity necessary for the interface magnetic layers 14 and 16 to maintain the high TMR effect can be retained by providing the diffusion preventing films 13 and 17, and crystallinity necessary for the sufficient perpendicular magnetic anisotropy can also be retained in the storage layer 12 and the reference layer 18. The MTJ element 1 is not limited to the stacked structures of FIGS. 1 and 2, but various modes can be adopted.

As illustrated in FIGS. 1 and 2, the insulating film 30 is buried between the MTJ elements 1, and an interlayer insulator (not illustrated) is provided on the MTJ element 1 and the insulating film 30. A contact plug (not illustrated) is provided in the interlayer insulator, and the contact plug electrically connects an upper electrode layer (not illustrated) of the MTJ element 1 and the wiring on the interlayer insulator. The MTJ elements 1 adjacent to each other can electrically be connected by the wiring.

Particularly, for example, the lower metallic layer 11 is made of such as Pt, Ir, Ru, and Cu. The lower metallic layer 11 acts as an orientation control film in forming the storage layer 12 formed on the lower metallic layer 11.

For example, the storage layer 12 is made of an element such as Fe, Co, and Ni, an element such as Cr, Pt, Pd, Ir, Rh, Ru, Os, Re, and Au, and an alloy thereof. Alternatively, an artificial-lattice perpendicular magnetic film in which the alloys are stacked may be used as the storage layer 12. Specifically, the storage layer 12 is stacked by a combination of a magnetic material layer and a non-magnetic material layer such as Co/Pt, Co/Pd, and Co/Ru. The magnetization characteristic can be adjusted by a composition of the magnetic material layer and a ratio of the magnetic layer and the non-magnetic layer. Alternatively, the storage layer 12 may be formed by a combination a Ru film and an antiferromagnetic material layer such as PtMn and IrMn.

For example, the tunnel junction layer 15 is made of such as MgO, CaO, SrO, TiO, VO, NbO, and $Al_2O_3$. Desirably the tunnel junction layer 15 is made of an oxide having an NaCl structure. The tunnel junction layer 15 made of a (100) preferentially-oriented insulating film can be obtained when crystal growth of the oxide is performed on a structure of an alloy mainly containing Fe, Co, and Ni, such as an amorphous CoFeB alloy. For example, the tunnel junction layer 15 has a thickness of about 10 Å and an area resistance value of 10 $\Omega\mu m^2$.

A layer of an L10-system ordered alloy layer FePd and FePt is used as the reference layer 18. Saturation magnetization and anisotropic magnetic energy of the ordered alloy layer can be adjusted by adding an element such as Cu to the ordered alloy layer.

For example, the cap layer 19 is made of Ru and Ta.

As to the interface magnetic layers 14 and 16, it is necessary to keep good coherency of an interface between a (100) plane of the tunnel junction layer 15 made of the oxide having the NaCl structure and the storage layer 12 and the reference layer 18. Therefore, desirably a material having small lattice incoherency to the (100) plane of the tunnel junction layer 15 is selected as the material for the interface magnetic layers 14 and 16. For example, CoFeB is used as the material for the interface magnetic layers 14 and 16. As described above, because the interface magnetic layers 14 and 16 have the high polarizability, and the MTJ element 1 includes the interface magnetic layers 14 and 16 to acquire the large TMR.

For example, the diffusion preventing films 13 and 17 are made of a high-melting-point such as Ti, Ta, W, Mo, Nb, Zr, and Hf, a nitride, or a carbide. As described above, in the heat treatment processes of the semiconductor memory device producing process, the diffusion preventing films 13 and 17 prevent the diffusion of the metallic element constituting each layer, thereby preventing the degradation of magnetization characteristics of the storage layer 12 and the reference layer 18 and the electric characteristics (such as TMR) of the MTJ element 1. Additionally, the crystallinity necessary for the interface magnetic layers 14 and 16 to maintain the high TMR effect can be retained by the diffusion preventing films 13 and 17, and the crystallinity necessary for the sufficient perpendicular magnetic anisotropy can also be retained in the storage layer 12 and the reference layer 18.

Desirably the protective film 20 is made of an insulating material in order to maintain an insulating property between an upper electrode layer (not illustrated) and the lower electrode layer 11. Examples of the insulating material include $Al_2O_3$, $SiO_2$, TiOx, and SiN. In forming the sidewall film 21 the protective film 20 prevents reducible hydrogen from mixing in the storage layer 12 and the reference layer 18.

The sidewall film 21 is made of SiN (plasma nitride), which has the compressive stress exceeding, for example, 1 GPa and is formed by plasma Chemical Vapor Deposition (CVD). Alternatively, a polysilicon film is deposited, and the sidewall film 21 may be made of a SiN film that is formed by nitrizing the polysilicon film.

The MTJ elements 1 of FIGS. 1 and 2 are produced as follows.

After each layer constituting the stacked structure of the MTJ element 1 is formed by a well-known method, a hard mask made of a material such as $SiO_2$ and SiN is formed on the stacked structure, the hard mask is patterned using a photoresist, and each layer is processed as the stacked structure of the MTJ element 1 using the patterned hard mask. For example, physical processing by IBE (Ion Beam Etching) or RIE is used in the processing. Because a noble metal is used in the thin tunnel junction layer 15 made of MgO and the like, a residue of the noble metal adheres to the sidewall of the MTJ element 1 during the processing, which sometimes causes a leakage in the MTJ element 1. Therefore, a tapered angle is optimized in the tunnel junction layer 15. Desirably a processing condition, a processing gas, and an aftertreatment are optimized such that the residue does not remain in processing the sidewall of the MTJ element 1.

Then the protective film 20 is formed so as to cover the sidewall and the upper surface of the MTJ element 1. At this point, in order not to damage each layer, desirably the protective film 20 is formed by Atomic Layer Deposition (ALD), CVD, or Physical Vapor Deposition (PVD). Then the sidewall film 21 made of SiN is formed. Possibly polarization of the magnetic films such as the storage layer 12 and the reference layer 18 are degraded by a hydrogen radical in generating the sidewall film 21. In the first embodiment, because the protective film 20 covers the MTJ element 1, the hydrogen radical does not invade into the magnetic films. As a result, the degradation of the MTJ element 1 can be suppressed. A process temperature in an insulating film forming process and a wiring depositing/processing process, which are performed after the formation of the MTJ element 1, is decreased to a range of 100° C. to 300° C., desirably to about 100° C. Therefore, the generation of the gas from the insulating film and the wiring and the diffusion of elements constituting the insulating film and the wiring can be suppressed to eliminate necessity to form the protective film 20.

After the SiN film is deposited using the plasma CVD so as to cover the MTJ element 1 with the protective film 20 interposed therebetween, anisotropic etching is performed to the SiN film to form the sidewall film 21, in which the portion covering the storage layer 12 is thicker than the portion covering the reference film 18. In the SiN film, a stress state can vary by changing a film deposition pressure of the plasma CVD, a plasma power, and the aftertreatment. By utilizing the fact, the sidewall film 21 is formed under the condition that the tensile stress is provided to the sidewall of the MTJ element 1. Particularly, for example, using a $SiH_4/NH_3/N_2$ gas, the sidewall film 21 is formed under the conditions of a low RF power of 0.5 to 1.0 kW, a low pressure of 200 kPa or more, and a low discharge frequency of 400 kHz. Ion bombardment is increased under the conditions to decrease a residual hydrogen concentration, so that the film having the tightly compressive stress can be formed.

The sidewall film 21 can also be formed by the following method. A polysilicon film is formed by long-throw sputtering on the semiconductor substrate 10 that is exposed between the MTJ elements 1. The polysilicon film is etched by the RIE or sputtering, and a particle that flies out by bombarding the etching portion is caused to adhere to the sidewall of the MTJ element 1, thereby forming the polysilicon film in which the portion covering the storage layer 12 is thicker than the portion covering the reference film 18. Alternatively, the SiN film is formed by nitrizing the polysilicon film, which allows the formation of the sidewall film 21 having the desired stress.

There is no limitation to the method for forming the sidewall film 21, but well-known methods such as the ALD, the sputtering, and evaporation may be adopted.

Magnetic anisotropy energy (energy to orient the magnetization direction toward a specific direction) is decreased with the progress of the miniaturization of the MTJ element, and stability of the magnetization directions of the storage layer and the reference layer included in the MTJ element is hardly maintained due to the thermal disturbance of the magnetic material (a fluctuation in magnetization direction of the magnetic material due to the thermal energy). The magnetic anisotropy energy is expressed by a product of magnetic anisotropy energy density and a magnetic material volume, and it is necessary to increase the magnetic anisotropy energy density of the magnetic film in order to increase energy against the thermal disturbance.

For example, in the case that an in-plane magnetic film having the magnetization direction in a film surface is used as the magnetic film of the MTJ element, shape magnetic anisotropy is generally utilized in order to increase the magnetic anisotropy energy density. However, an inverting current is sensitive to an element shape, it is necessary to increase an aspect ratio of the MTJ element, and a variation in element shape in the micro MTJ element largely affects the characteristic of the MTJ element. For the above reasons, the magnetic anisotropy energy density is hardly increased by utilizing the shape magnetic anisotropy. Even if a material system having large crystalline anisotropy is used as the in-plane magnetic film, a magnetization dispersion in an in-plane direction is increased, and the MTJ element is hardly produced.

Therefore, in the first embodiment, the perpendicular magnetic film is used as the magnetic film of the MTJ element, and the crystalline magnetic anisotropy is utilized instead of the shape magnetic anisotropy, so that the compact MTJ element can be fabricated compared with the case that the in-plane magnetic film is used. At the same time, generally the material having the crystalline magnetic anisotropy (magnetization direction) in the perpendicular direction has a problem in that a magneto-resistive ratio (MR ratio) is small because of low polarizability. On the other hand, because the material having the high polarizability has the magnetic anisotropy in the in-plane direction, unfortunately the material is hardly used as the perpendicular magnetic film. It is also conceivable that, by thinning the magnetic film, a behavior of the magnetic material is utilized to stabilize the magnetization direction in the perpendicular direction. However, when each layer of the magnetic film is thinned, an element contained in each layer diffuses easily by heat applied in the production process, which results in a problem in that the characteristic of the MTJ element is degraded.

On the other hand, in the first embodiment, the semiconductor memory device includes the sidewall film 21 that provides the tensile stress to the MTJ element 1 along the magnetization directions of the storage layer 12 and the reference layer 18, so that the strain can be provided to the lattices of the magnetic films of the storage layer 12 and the reference layer 18 in a constant direction to stabilize the magnetization in the direction. Accordingly, in the first embodiment, even if the material having the high MR ratio is used, the magnetization direction can be stabilized without thinning the magnetic film. That is, the MTJ element 1 having the stable characteristic can be obtained. Additionally, according to the first embodiment, in the sidewall film 21, the portion covering the storage layer 12 is thickened to further apply the stress to the storage layer 12. Therefore, the stability to the thermal disturbance in the magnetization direction stored in the storage layer 12 can be improved to suppress the variations of the magnetic and electric characteristics of the MTJ element 1.

Specifically, in an electric characteristic evaluation of the MTJ element 1 of the first embodiment, the element area resistance value (RA value) was 10 $\Omega\mu m^2$ and the magneto-resistive ratio (MR ratio) was 100% or more.

Figure 3:
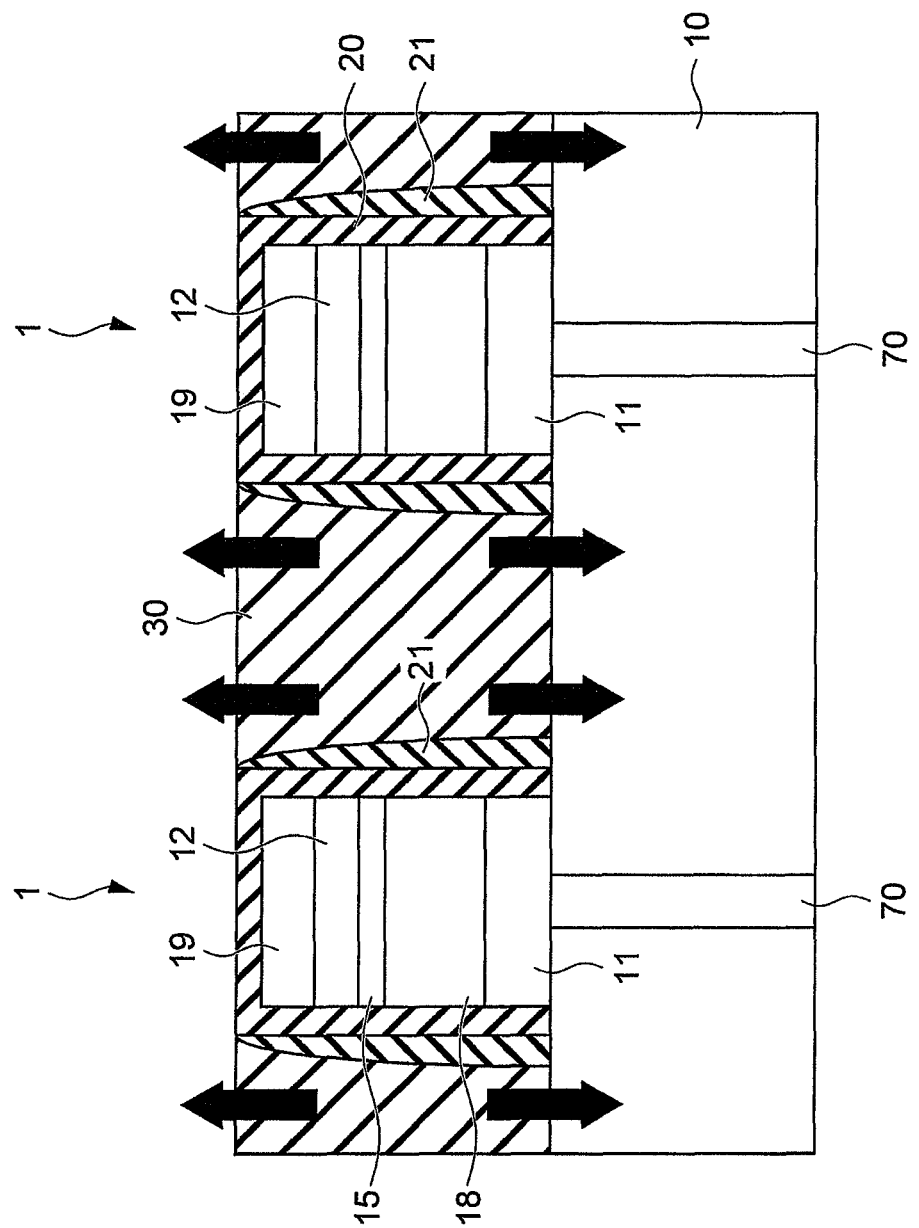
FIG. 3 is a sectional view (part 3) of the semiconductor memory device of the first embodiment.

In the first embodiment, the reference layer 18 is stacked above the storage layer 12 in the MTJ element 1. Alternatively, as illustrated in FIG. 3, the storage layer 12 may be stacked above the reference layer 18. In this case, in the sidewall film 21, the portion covering the reference layer 18 is thickened to further apply the stress to the reference layer 18. Therefore, the magnetization direction of the reference layer 18 is further stabilized, and the degradation of the MR ratio can be avoided to improve the thermal stability and reliability of the MTJ element 1.

Second Embodiment

Figure 4:
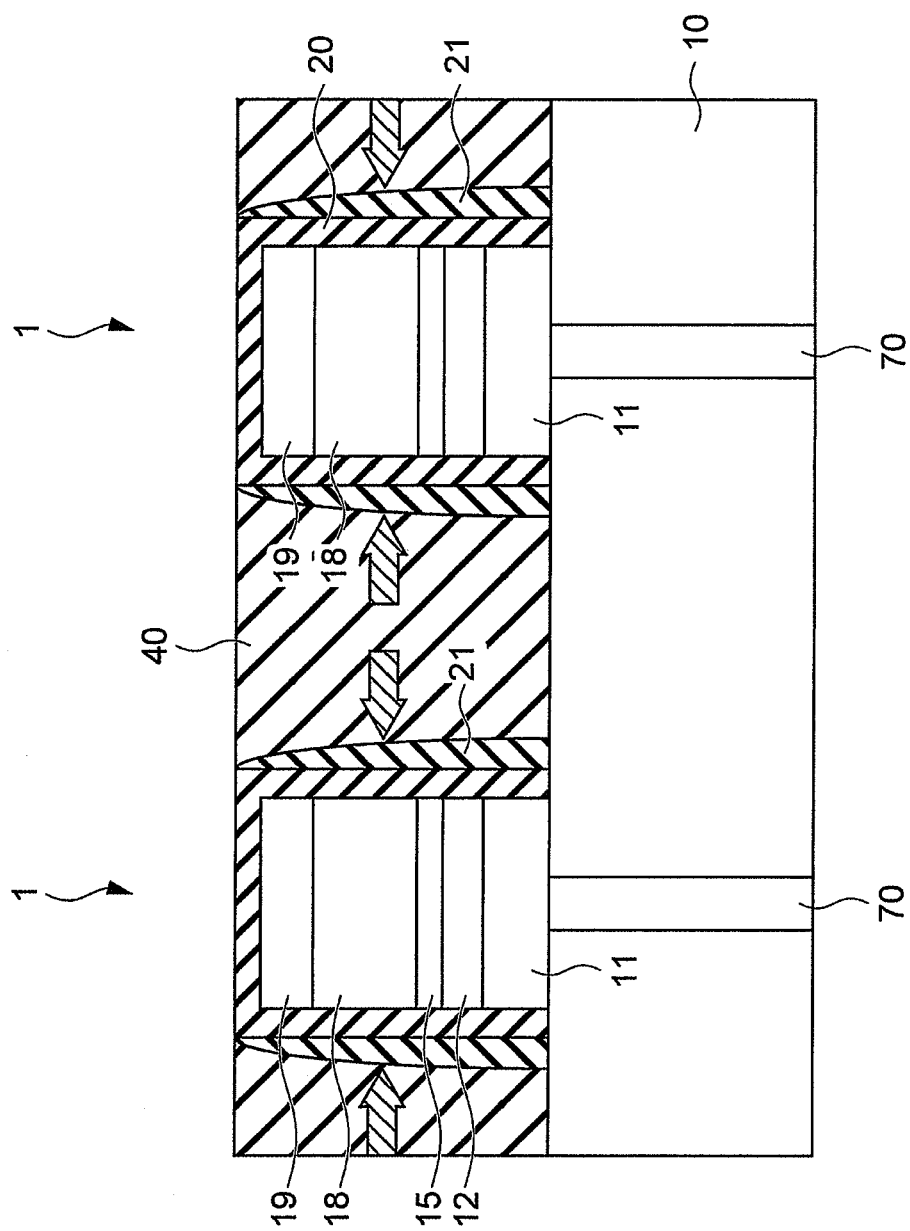
FIG. 4 is a sectional view of a semiconductor memory device according to a second embodiment.

A second embodiment differs from the first embodiment in that a buried film 40 that thermally expands is buried between the MTJ elements 1 adjacent to each other. A semiconductor memory device of the second embodiment will be described with reference to FIG. 4. FIG. 4 illustrates a section of the semiconductor memory device of the second embodiment. The description of the portion common to the first embodiment is omitted.

As illustrated in FIG. 4, the MTJ elements 1 having the same stacked structure as the first embodiment are arrayed, and the buried film 40 is buried between the MTJ elements 1. The buried film 40 thermally expands, thereby providing the compressive stress to the MTJ element 1 along the direction perpendicular to the magnetization directions of the storage layer 12 and the reference layer 18 as indicated by arrows in FIG. 4. Accordingly, the sidewall film 21 can provide a strain in a constant direction to each lattice in the magnetic films constituting the storage layer 12 and the reference layer 18, and stabilize the magnetization in the direction.

Any material may be used as the buried film 40 as long as the material thermally expands. Either the insulating material or the conductive material may be used as the buried film 40 because the MTJ element 1 is covered with the protective film 20 and the sidewall film 21 to prevent a short-circuit between the lower electrode layer 11 and the upper electrode layer (not illustrated). For example, an oxide or a nitride of one of Ti, Nb, Mo, W, Si, Al, Mg, and Si can be cited as the material used for the buried film 40.

In the case that the buried film 40 is used as a self-alignment contact like a NOR type memory, desirably the buried film 40 includes at least a part of the conductive material. In this case, the material that exerts the conductive property after an oxidation treatment or a nitrization treatment is used. For example, TiN, NbN, and $WN_2$ can be cited as the conductive material.

In the case that the insulation is more securely established between the MTJ elements 1, desirably the buried film 40 is made of the insulating material. For example, TiOx, NbO, MoOx, WOx, $SiO_2$, $Al_2O_3$, SiN, and AlN can be cited as the material that exerts the insulating property after the oxidation treatment or the nitrization treatment.

The buried film 40 of FIG. 4 is produced as follows.

The metallic film made of Ti, Si, Mg, or Al is deposited between the MTJ elements 1 by the sputtering or the evaporation, and the metallic film is oxidized and expanded at 300° C. or less in an oxygen atmosphere, thereby forming the buried film 40. At this point, active oxygen may be generated by plasma to oxidize the metallic film. The buried film 40 made of the nitride can be formed in the same way.

Polysilazane, Silicon On Glass (SOG), polisilicon, or a mixture containing the component thereof may be deposited so as to cover the MTJ element 1. Then the applied material can be expanded through the oxidation treatment or the nitrization treatment to form the buried film 40.

According to the second embodiment, the semiconductor memory device includes the buried film 40 that provides the compressive stress to the MTJ element 1 along the direction perpendicular to the magnetization directions of the storage layer 12 and the reference layer 18. Therefore, similarly to the first embodiment, the strain can be provided to the lattices of the magnetic films of the storage layer 12 and the reference layer 18 in a constant direction to stabilize the magnetization in the direction. That is, in the second embodiment, the magnetization direction can further be stabilized by a combination of the stress generated by the buried film 40 and the stress generated by the sidewall film 21. Because the buried film 40 that thermally expands is produced by burying the buried film 40 between the MTJ elements 1, the MRAM can easily be formed without largely changing the production process.

In the second embodiment, the sidewall film 21 may not be provided, or the sidewall film 21 may be made of a material having no stress. In the second embodiment, similarly to the first embodiment, the positions of the storage layer 12 and the reference layer 18 may be replaced with each other.

Third Embodiment

Figure 5:
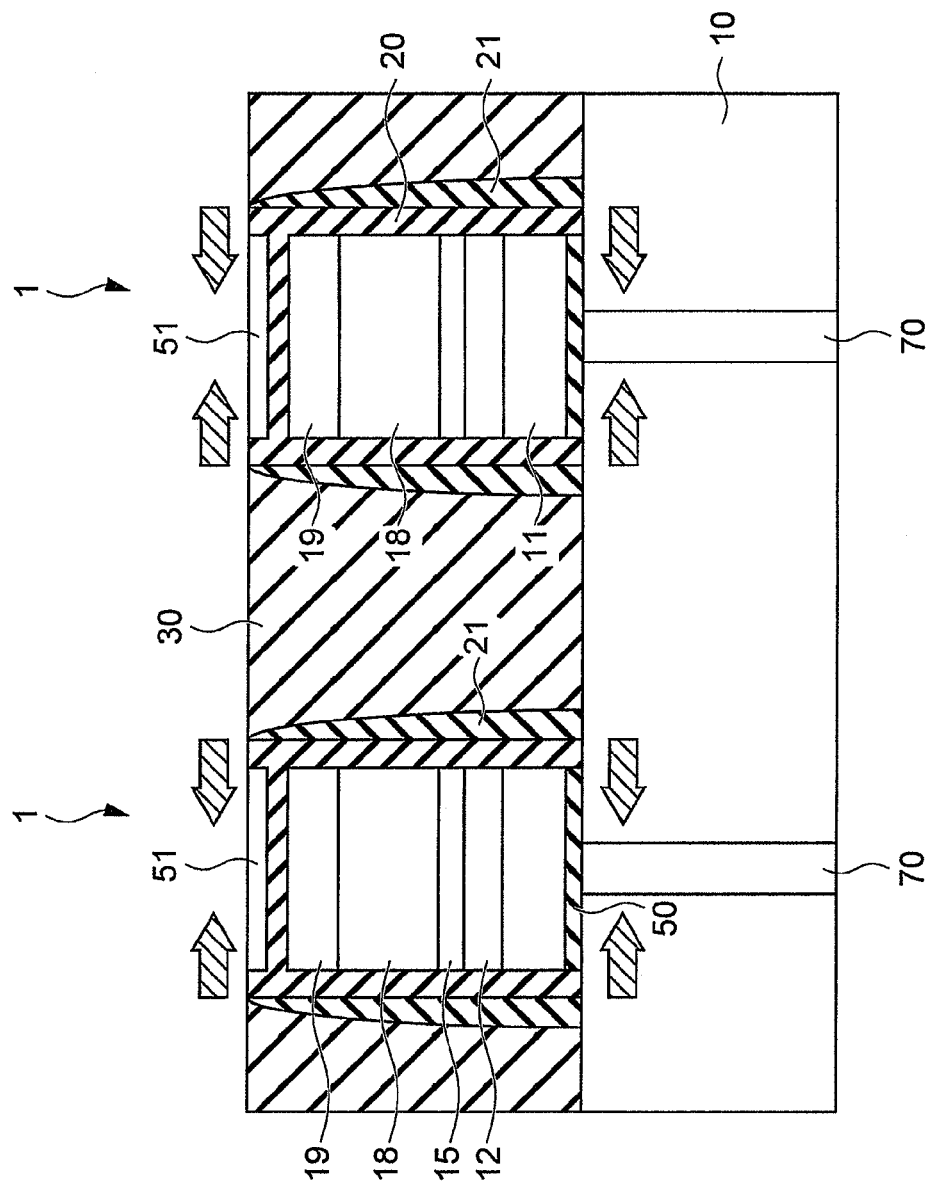
FIG. 5 is a sectional view of a semiconductor memory device according to a third embodiment.

A third embodiment differs from the first embodiment in that the MTJ element 1 includes a bottom stress applying film 50 and an upper stress applying film 51. A semiconductor memory device of the third embodiment will be described with reference to FIG. 5. FIG. 5 illustrates a section of the semiconductor memory device of the third embodiment. The description of the portion common to the first embodiment is omitted.

As illustrated in FIG. 5, the MTJ elements 1 having the same stacked structure as the first embodiment are arrayed, the bottom stress applying film 50 is formed in a lower portion of the MTJ element 1, and the upper stress applying film 51 is formed in an upper portion of the MTJ element 1. As indicated by arrows in FIG. 5, the bottom stress applying film 50 and the upper stress applying film 51 provide the compressive stresses to the MTJ element 1 along the direction perpendicular to the magnetization directions of the storage layer 12 and the reference layer 18. Accordingly, the sidewall film 21 can provide a strain in a constant direction to each lattice in the magnetic films constituting the storage layer 12 and the reference layer 18, and stabilize the magnetization in the direction.

Any film having the same stress as the first embodiment may be used as the bottom stress applying film 50. For example, the SiN film, the oxide film, and a dielectric film, which have the compressive stress exceeding 1 GPa, may be used. Any film having the same stress as the first embodiment may be used as the upper stress applying film 51. For example, the stacked film, the conductive film, and the mixed film, which have the compressive stress exceeding 1 GPa, may be used.

The bottom stress applying film 50 and the upper stress applying film 51 of FIG. 5 are produced as follows.

In the case that the SiN film is used as the bottom stress applying film 50, the bottom stress applying film 50 may be produced under the same condition as the first embodiment. Alternatively, for example, an amorphous oxide (such as $Al_2O_3$, $TiO$, $HfO_2$, and $SiO_2$) or an amorphous film having a high-dielectric property is deposited, the heat treatment such as Rapid Thermal Annealing (RTA) and Rapid Thermal Oxidation (RTO) is performed to densify the film, thereby forming the bottom stress applying film 50. Alternatively, the bottom stress applying film 50 may be formed by the PVD such as the sputtering, the CVD, and the application method.

In the case that the SiN film is used as the upper stress applying film 51, the upper stress applying film 51 may be produced in the same way as the first embodiment. For example, using the $SiH_4/NH_3/N_2$ gas, the upper stress applying film 51 can be formed under the conditions of a low RF power of 0.3 kW or less, a high pressure, and a high discharge frequency of 13.56 MHz. Desirably the upper stress applying film 51 is formed on the protective film 20, in order to avoid the degradation of the polarization of the magnetic films of the storage layer 12 and the reference layer 18 due to a hydrogen radical generated in forming the upper stress applying film 51.

Alternatively, the upper stress applying film 51 may be provided on the hard mask (not illustrated) that is used to form the MTJ element 1. Alternatively, the hard mask material may be used as the upper stress applying film 51. In the case that the upper stress applying film 51 is formed on the hard mask, after each layer constituting the stacked structure of the MTJ element 1 is formed by a well-known method, the protective film 20, the hard mask made of a material such as $SiO_2$, and the SiN film are formed on the stacked structure, the hard mask is patterned using the photoresist, and each layer is processed as the stacked structure of the MTJ element 1 using the patterned hard mask by the RIE. The processed SiN film can be used as the upper stress applying film 51.

In the third embodiment, the semiconductor memory device includes bottom stress applying film 50 and the upper stress applying film 51, which provide the compressive stresses to the MTJ element 1 along the direction perpendicular to the magnetization directions of the storage layer 12 and the reference layer 18. Therefore, similarly to the first embodiment, the strain can be provided to the lattices of the magnetic films of the storage layer 12 and the reference layer 18 in a constant direction to stabilize the magnetization in the direction. That is, in the third embodiment, the magnetization direction can further be stabilized by a combination of the stresses generated by the bottom stress applying film 50 and the upper stress applying film 51. In the third embodiment, compared with the case that the stress applying film is formed on the sidewall of the MTJ element 1, the thick stress applying film can easily be formed at high deposition rate by forming the stress applying films in the upper and lower portions of the MTJ element 1. Accordingly, in the third embodiment, the stress applying film is thickened, which allows the larger stress to be applied to the MTJ element 1.

In the third embodiment, both the bottom stress applying film 50 and the upper stress applying film 51 are provided. Alternatively, only one of the bottom stress applying film 50 and the upper stress applying film 51 may be provided. Therefore, the production process can partially eliminate. In the third embodiment, the sidewall film 21 may not be provided, or the sidewall film 21 may be made of a material having no stress. Additionally, the buried film 40 of the second embodiment may be provided. In the third embodiment, similarly to the first embodiment, the positions of the storage layer 12 and the reference layer 18 may be replaced with each other.

Fourth Embodiment

Figure 6:
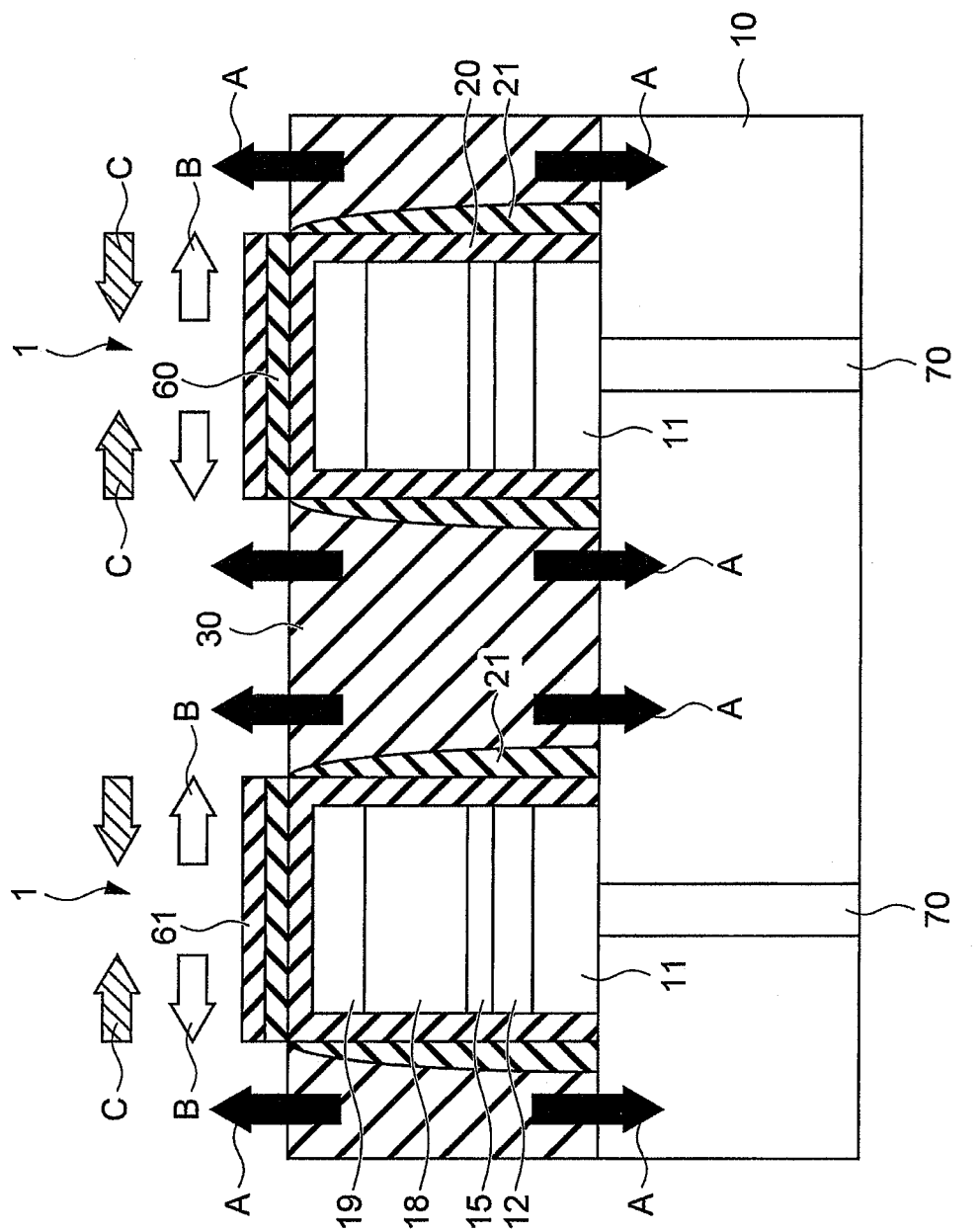
FIG. 6 is a sectional view of a semiconductor memory device according to a fourth embodiment.

A fourth embodiment differs from the first embodiment in that the upper surface and the side surface of the MTJ element 1 are covered with the stress applying film applying the stress to the MTJ element 1 and that the stress applying film covering the upper surface of the MTJ element 1 is constructed by two-layer stacked film. A semiconductor memory device of the fourth embodiment will be described with reference to FIG. 6. FIG. 6 illustrates a section of the semiconductor memory device of the fourth embodiment. The description of the portion common to the first embodiment is omitted.

As illustrated in FIG. 6, the MTJ elements 1 having the same stacked structure as the first embodiment are arrayed, and the upper surface and the sidewall of the MTJ element 1 are covered with a first stress applying film 60. Similarly to the first embodiment, in the first stress applying film 60 on the sidewall of the MTJ element 1, desirably the portion covering the storage layer 12 is thicker than the portion covering the reference film 18. Additionally, a second stress applying film 61 is formed on the upper surface of the MTJ element 1 with the first stress applying film 60 interposed therebetween.

Similarly to the first embodiment, the first stress applying film 60 is one that provides the tensile stress to the sidewall of the MTJ element 1 so as to vertically drag the MTJ element 1 along the magnetization directions of the storage layer 12 and the reference layer 18 as indicated by arrows A in FIG. 6. At the same time as the first stress applying film 60 provides the tensile stress as indicated by arrows A, the first stress applying film 60 also provides the tensile stress to the upper surface of the MTJ element 1 along the direction perpendicular to the magnetization directions of the storage layer 12 and the reference layer 18 as indicated by arrows B in FIG. 6. Undesirably the tensile stress indicated by the arrows B degrades the characteristic of the MTJ element 1. However, in the fourth embodiment, the second stress applying film 61 is formed on the upper surface of the MTJ element 1 with the first stress applying film 60 interposed therebetween, and the second stress applying film 61 provides the compressive stress to the upper surface of the MTJ element 1 along the direction perpendicular to the magnetization directions of the storage layer 12 and the reference layer 18 as indicated by arrows C in FIG. 6, thereby relaxing or cancelling the tensile stress indicated by the arrows B. Therefore, the degradation of the characteristic of the MTJ element 1 can be avoided. Desirably the second stress applying film 61 is one that provides the compressive stress (arrow C) larger than the tensile stress (arrow B) generated by the first stress applying film 60 to the upper surface of the MTJ element 1. Therefore, the stress can be provided similarly to the first to third embodiments, and the strain can be provided to the lattices of the magnetic films of the storage layer 12 and the reference layer 18 in a constant direction to stabilize the magnetization in the direction.

Any film having the same stress as the first embodiment may be used as the first stress applying film 60. For example, the plasma SiN film and an $Al_2O_3$ film, which have the compressive stress exceeding 1 GPa, may be used. Any film having the same stress as the first embodiment may be used as the second stress applying film 61. For example, the SiN film and a metal oxide film, which have the compressive stress exceeding 1 GPa, may be used.

The first stress applying film 60 and the second stress applying film 61 of FIG. 6 are produced as follows.

Similarly to the first embodiment, after the MTJ element 1 is formed, the first stress applying film 60 is deposited so as to cover the upper surface and the sidewall of the MTJ element 1. For example, the first stress applying film 60 can be formed by Metal Organic Chemical Vapor Deposition (MOCVD) or ALD.

Then, for example, the second stress applying film 61 is formed on the upper surface of the MTJ element 1 by the sputtering. For example, when the plasma SiN film is used as the second stress applying film 61, the second stress applying film 61 may be formed under the same condition as the first embodiment. Alternatively, for example, the amorphous oxide (such as $Al_2O_3$, TiO, $HfO_2$, and $SiO_2$) or the amorphous film having the high-dielectric property is deposited, the heat treatment such as the RTA and the RTO is performed to densify the film, thereby forming the bottom stress applying film 61. Because the second stress applying film 61 is anisotropically deposited, the second stress applying film 61 is deposited on the upper surface of the MTJ element 1 while hardly deposited on the sidewall of the MTJ element 1.

In the fourth embodiment, after the first stress applying film 60 and the second stress applying film 61 are formed, the first stress applying film 60 and the second stress applying film 61 are irradiated with the ion from above. Therefore, the necessity of the photolithographic process is eliminated. Accordingly, the production process is shortened and the process damage provided to the MTJ element 1 is relatively decreased, so that the reliability of the MTJ element 1 can be enhanced.

According to the fourth embodiment, the semiconductor memory device includes the first stress applying film 60 that provides the tensile stress to the sidewall of the MTJ element 1 along the magnetization directions of the storage layer 12 and the reference layer 18. Therefore, similarly to the first embodiment, the strain can be provided to the lattices of the magnetic films of the storage layer 12 and the reference layer 18 in a constant direction to stabilize the magnetization in the direction. Additionally, the semiconductor memory device includes the second stress applying film 61 that provides the compressive stress to the upper surface of the MTJ element 1 along the direction perpendicular to the magnetization directions of the storage layer 12 and the reference layer 18. Therefore, the tensile stress provided by the first stress applying film 60 located on the upper surface of the MTJ element 1 can be relaxed or cancelled to avoid the degradation of the characteristic of the MTJ element 1, which is caused by the first stress applying film 60 located on the upper surface of the MTJ element 1.

In the fourth embodiment, the buried film 40 of the second embodiment may be provided, and the bottom stress applying film 50 of the third embodiment may be provided. In the fourth embodiment, similarly to the first embodiment, the positions of the storage layer 12 and the reference layer 18 may be replaced with each other.

In the first to fourth embodiments, the silicon substrate is not always used as the semiconductor substrate 10, but another substrate may be used. Alternatively, a semiconductor structure may be formed on various substrates.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising a plurality of magneto-resistance elements, wherein each of the magneto-resistance elements includes:
    a first magnetic layer formed on a semiconductor substrate, the first magnetic layer having an easy axis of magnetization perpendicular to a film surface thereof;
    a non-magnetic layer formed on the first magnetic layer; a second magnetic layer formed on the non-magnetic layer, the second magnetic layer having an easy axis of magnetization perpendicular to a film surface thereof; and
    a sidewall film provided so as to cover a sidewall of each of the magneto-resistance elements with a protective film interposed therebetween, the sidewall film providing a tensile stress to the magneto-resistance element along the easy axis of magnetization.

2. The semiconductor memory device according to claim 1, wherein, in the sidewall film, a portion covering the first magnetic layer is thicker than a portion covering the second magnetic layer.

3. The semiconductor memory device according to claim 1, wherein the sidewall film is a silicon nitride.

4. The semiconductor memory device according to claim 1, wherein each of the magneto-resistance elements further includes:
    a first interface magnetic layer formed between the first magnetic layer and the non-magnetic layer; and
    a second interface magnetic layer formed between the second magnetic layer and the non-magnetic layer.

5. The semiconductor memory device according to claim 4, wherein each of the magneto-resistance elements further includes:
    a first diffusion preventing film formed between the first magnetic layer and the first interface magnetic layer; and
    a second diffusion preventing film formed between the second interface magnetic layer and the second magnetic layer.

6. The semiconductor memory device according to claim 1, further comprising
    a buried film between the magneto-resistance elements adjacent to each other so as to provide a compressive stress to the magneto-resistance elements in a direction perpendicular to the easy axis of magnetization.

7. The semiconductor memory device according to claim 6, wherein the buried film is a nitride or an oxide consisting of one of Ti, Nb, Mo, W, Si, Al, and Mg.

8. The semiconductor memory device according to claim 1, further comprising:
- a bottom stress applying film formed below the first magnetic layer, the bottom stress applying film providing a compressive stress to the magneto-resistance element in a direction perpendicular to the easy axis of magnetization; and/or
- an upper stress applying film formed above the second magnetic layer, the upper stress applying film providing a compressive stress to the magneto-resistance element in the direction perpendicular to the easy axis of magnetization.

9. The semiconductor memory device according to claim 8, wherein the bottom stress applying film and the upper stress applying film are silicon nitride.

10. The semiconductor memory device according to claim 1, further comprising:
- an upper stress applying film formed above the second magnetic layer, wherein the upper stress applying film includes a first stress applying film and a second stress applying film, the first stress applying film is formed above the second magnetic layer and provides a tensile stress to the magneto-resistance element in a direction perpendicular to the easy axis of magnetization, and the second stress applying film is formed above the first stress applying film and provides a compressive stress to the magneto-resistance element in the direction perpendicular to the easy axis of magnetization.

11. The semiconductor memory device according to claim 10, wherein the first and second stress applying film are silicon nitride film.

* * * * *